(12) United States Patent
Dai (10) Patent No.: US 9,343,032 B2
(45) Date of Patent: May 17, 2016

(54) GOA CIRCUIT STRUCTURE SHARING GOA PULL-DOWN CIRCUITS TO REDUCE TFT STRESS OF THE GOA PULL-DOWN CIRCUITS

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/929,239

(22) Filed: Oct. 30, 2015

(65) Prior Publication Data

US 2016/0055815 A1    Feb. 25, 2016

Related U.S. Application Data

(62) Division of application No. 14/347,586, filed on Mar. 26, 2014, now Pat. No. 9,311,880.

(51) Int. Cl.
*G09G 3/36* (2006.01)
*G11C 19/28* (2006.01)

(52) U.S. Cl.
CPC ............ *G09G 3/3677* (2013.01); *G09G 3/3648* (2013.01); *G11C 19/28* (2013.01); *G09G 2300/0408* (2013.01); *G09G 2300/0809* (2013.01); *G09G 2310/0205* (2013.01); *G09G 2310/0251* (2013.01); *G09G 2310/0286* (2013.01); *G09G 2310/06* (2013.01); *G09G 2310/08* (2013.01); *G09G 2320/043* (2013.01)

(58) Field of Classification Search
None
See application file for complete search history.

(56) References Cited

U.S. PATENT DOCUMENTS

| 2010/0039363 A1* | 2/2010 | Lee ...................... G09G 3/3266 345/100 |
| 2014/0198023 A1* | 7/2014 | Hsu ...................... G09G 3/3674 345/99 |

* cited by examiner

*Primary Examiner* — David D Davis
(74) *Attorney, Agent, or Firm* — Andrew C. Cheng (57) ABSTRACT

A GOA circuit structure includes multiple twined GOA units cascaded with each other. Each twined GOA unit includes a (2N−1)-level GOA unit and a 2N-level GOA unit, which has a first pull-down holding circuit, a second pull-down holding circuit, a third pull-down holding circuit, and a fourth pull-down holding circuit connected with the (2N−1)-level gate signal point (Q(2N−1)) and the 2N-level gate signal point (Q(2N)). Through inputting a first clock signal, a second clock signal, a third clock signal, and a fourth clock signal, the first pull-down holding circuit, the second pull-down holding circuit, the third pull-down holding circuit, and the fourth pull-down holding circuit are made working alternately. The GOA circuit structure makes each portion work for ¼ time and take rest for ¾ time by sharing the pull-down holding circuit, which can reduce the TFT stress of the pull-down holding circuit.

4 Claims, 8 Drawing Sheets

GOA CIRCUIT STRUCTURE SHARING GOA PULL-DOWN CIRCUITS TO REDUCE TFT STRESS OF THE GOA PULL-DOWN CIRCUITS

CROSS REFERENCE TO RELATED APPLICATIONS

This is a divisional application of co-pending U.S. patent application Ser. No. 14/347,586, filed on Mar. 26, 2014.

BACKGROUND OF THE INVENTION

1. Field of the Invention

The present invention relates to the field of liquid crystal display technology, and in particular to a GOA circuit structure.

2. The Related Arts

Liquid crystal display has many advantages of thin body, energy saving, no radiation, etc., which has been widely used. The liquid crystal display on the existing market is mostly backlight liquid crystal display, which comprises a liquid crystal panel and a backlight module. The working principle of the liquid crystal panel is to place liquid crystal molecules between two parallel glass substrates, and then apply driving voltage to the two parallel glass substrates to control the rotation orientation of the liquid crystal molecules, which refracts the light from the backlight module to generate image.

In the active matrix liquid crystal display, each pixel has a thin film transistor (TFT). The gate thereof is connected to the horizontal scanning line, the drain thereof is connected to the data line in the vertical direction, and the source thereof is connected to the pixel electrode. Applying enough voltage on the horizontal scanning line will turn on all TFTs on this line. At this time, the pixel electrodes on the horizontal scanning line will be connected with the data lines in the vertical direction, then write the display signal on the data lines into pixel, and control various liquid crystal transmittances to control the color. At present, the horizontal scanning lines of the active matrix liquid crystal display panel are mainly driven by the external IC of the panel. The external IC of the panel can control the each level horizontal scanning line to charge and discharge level by level. However, the gate driver on array (GOA) use the existing thin film transistor liquid crystal display array process to produce the gate row scanning driving signal circuit on the array substrate, which achieve the driving mode of progressively scanning the gate. Therefore, it can utilize the original process of the liquid crystal display panel to produce the driving circuit of the horizontal scanning line on the array substrate, which can replace the external IC to drive the horizontal scanning line. The GOA technology can reduce the bonding process of the external IC, have chance to improve the capacity and decrease the product cost, and make the liquid crystal display panel more suitable for the production of narrow border or borderless display products.

The existing GOA circuit usually comprises multiple GOA units cascaded with each other. Each level GOA unit correspondingly drives one-level horizontal scanning line. GOA unit mainly comprises a pull-up part, a pull-up control part, a transfer part, a key pull-down part, a pull-down holding part, and a boost capacitor used to raise potential. The pull-up part is mainly used to output clock signal into gate signal; the pull-up control part is mainly used to control the turning-on time of the pull-up part, which is usually connected with the transfer signal or the gate signal transferred from the preceding level GOA circuit; the pull-down part is used to pull-down the gate to low potential at a first time, that is, close the gate signal; the pull-down holding part is used to hold the gate outputting signal and the gate signal (usually called Q point) of the pull-up part in the off state (negative potential), which usually has two pull-down holding module working alternately; the boast capacitor is used to twice raise the Q point, which is beneficial to the G(N) output of the pull-up part.

Figure 1:
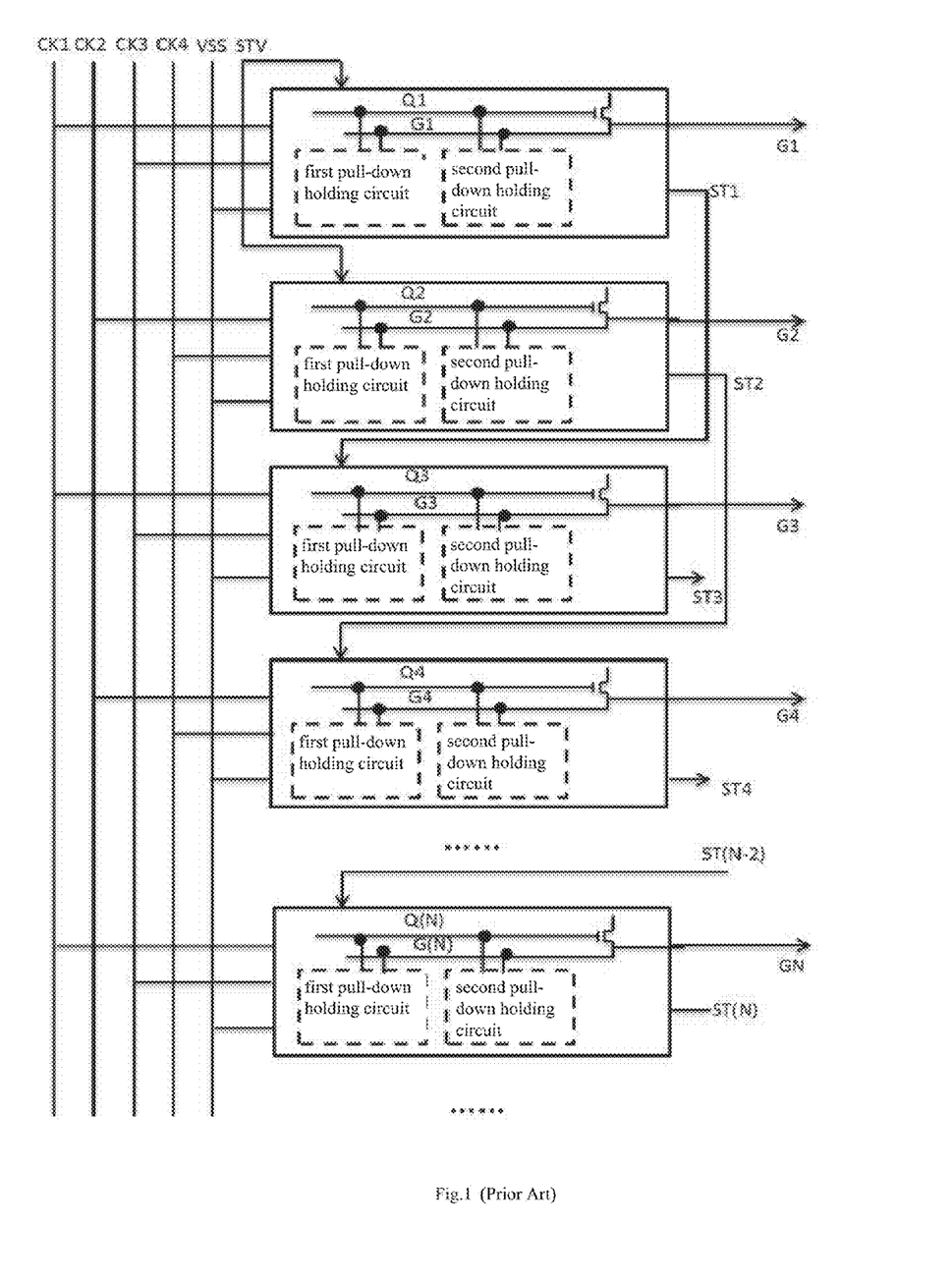
FIG. 1 is a schematic view illustrating the GOA circuit structure according to the existing technology.

In the existing GOA circuit structure, basically, the above sections are placed in the same level GOA unit circuit, especially in amorphous silicon GOA circuit, the two important pull-down holding circuit are working alternately in the same level GOA circuit, as shown in FIG. 1, which is a schematic view illustrating the GOA circuit structure according to the existing technology. The metal wires used to transfer DC low voltage VSS, four high frequency clock signals CK1-CK4 are placed at the peripheral of each level GOA circuit. Each level GOA unit respectively has first pull-down holding circuit and second pull-down holding circuit. The first pull-down holding circuit and the second pull-down holding circuit are respectively connected between Q(N) and G(N), which is used to alternately hold the Q(N) and the G(N) in the off state. The N-th level GOA unit circuit respectively receive VSS and one CK signal of CK1-CK4 to generate G(N) signal. STV signal is a starting signal of the GOA circuit. Therefore, the STV signal is used to start the first level and the second level GOA unit circuit, and the starting signal of the latter N-th level GOA circuit is generated from the ST(N−2) signal of the transfer part of the former (N−2)-th level circuit. In this way, it can gradually turn on the GOA driving circuit and achieve the scanning drive. The connecting method within each GOA unit circuits shown in FIG. 1 can ensure that the GOA signal can be gradually transferred, which allows each level horizontal scanning line be gradually charged and discharged.

This structure has the following disadvantages:

(1) The first and the second pull-down holding circuit work alternately, namely, the working time and the rest time are half-half, but the stress recovery time is still shorter for TFT, so that the failure of the pull-down holding circuit is more serious than the other.

(2) The pull-down holding circuit and the Q point of the adjacent level GOA units have no interaction, so the actual effect of the circuit is inefficient, which is because the gate signal is only turned on for a moment, and the other long time is in close state, the pull-down time and the Q point waveform of the adjacent GOA units are basically the same.

(3) The pull-down holding part is generally using a high-frequency control signals signal, which will increase the power consumption of the circuit; and the two low-frequency control signals are also used, but they will also increase the stress effect of TFT.

SUMMARY OF THE INVENTION

The technical issue to be solved by the present invention is to provide a GOA circuit structure, sharing GOA pull-down circuits to reduce TFT stress of the GOA pull-down circuits, which reduces the working time of each pull-down holding circuit by sharing GOA pull-down circuit, so that it has more time to recover the stress.

In order to solve the above issue, the present invention provides a GOA circuit structure, sharing GOA pull-down circuits to reduce TFT stress of the GOA pull-down circuits, which comprises multiple twined GOA units cascaded with each other. Assuming N is a natural number, the N-level GOA unit charges the N-level horizontal scanning line in the displaying area, and each said twined GOA unit comprises the (2N−1)-level GOA unit and the 2N-level GOA unit. The (2N−1)-level GOA unit comprises a first pull-down holding circuit and a second pull-down holding circuit respectively connected with the (2N−1)-level gate signal point and the (2N−1)-level horizontal scanning line. The 2N-level GOA unit comprises a third pull-down holding circuit and a fourth pull-down holding circuit respectively connected with the 2N-level gate signal point and the 2N-level horizontal scanning line. The (2N−1)-level gate signal point is further connected with the third pull-down holding circuit and the fourth pull-down holding circuit respectively. The 2N-level gate signal point is further connected with the first pull-down holding circuit and the second pull-down holding circuit respectively.

The first pull-down holding circuit comprises:
a first thin film transistor, of which the gate is inputting a second clock signal, and the source and the drain are respectively inputting a first clock signal and connected to a first circuit point, wherein whether the first pull-down holding circuit is working or not depends on the potential level of the first circuit point.

The second pull-down holding circuit comprises:
a second thin film transistor, of which the gate is inputting a fourth clock signal, and the source and the drain are respectively inputting a third clock signal and connected to a second circuit point, wherein whether the second pull-down holding circuit is working or not depends on the potential level of the second circuit point.

The third pull-down holding circuit comprises:
a third thin film transistor, of which the gate is inputting a third clock signal, and the source and the drain are respectively inputting a second clock signal and connected to a third circuit point, wherein whether the third pull-down holding circuit is working or not depends on the potential level of the third circuit point.

The fourth pull-down holding circuit comprises:
a fourth thin film transistor, of which the gate is inputting a first clock signal, and the source and the drain are respectively inputting a fourth clock signal and connected to a fourth circuit point, wherein whether the fourth pull-down holding circuit is working or not depends on the potential level of the fourth circuit point.

The first clock signal, the second clock signal, the third clock signal, and the fourth clock signal are provided to make the first pull-down holding circuit, the second pull-down holding circuit, the third pull-down holding circuit, and the fourth pull-down holding circuit work alternately.

In the above-described GOA circuit structure, a first pull-up clock signal, a second pull-up clock signal, a third pull-up clock signal, and a fourth pull-up clock signal are respectively input into the pull-up circuits of the GOA units of the (2N−1)-level, the 2N-level, the (2N−1)-level, and the (2N+2)-level to respectively charge the corresponding horizontal scanning line in the displaying area. The first clock signal, the second clock signal, the third clock signal, and the fourth clock signal respectively correspond to the first pull-up clock signal, the second pull-up clock signal, the third pull-up clock signal, and the fourth pull-up clock signal.

In the above-described GOA circuit structure, the first clock signal, the second clock signal, the third clock signal, and the fourth clock signal respectively correspond to four low-frequency clock signals.

In the above-described GOA circuit structure, the first pull-down holding circuit further comprises:
a fifth thin film transistor, of which the gate is connected to the (2N−1)-level gate signal point, and the source and the drain are respectively connected to the first circuit point and inputting a DC low voltage;

a sixth thin film transistor, of which the gate is connected to the first circuit point, and the source and the drain are respectively connected to the (2N−1)-level gate signal point and inputting the DC low voltage;
a seventh thin film transistor, of which the gate is connected to the first circuit point, and the source and the drain are respectively connected to the (2N−1)-level horizontal scanning line and inputting the DC low voltage; and
an eighth thin film transistor, of which the gate is connected to the 2N-level gate signal point, and the source and the drain are respectively connected to the first circuit point and inputting the DC low voltage.

In the above-described GOA circuit structure, the second pull-down holding circuit further comprises:
a ninth thin film transistor, of which the gate is connected to the (2N−1)-level gate signal point, and the source and the drain are respectively connected to the second circuit point and inputting the DC low voltage;
a tenth thin film transistor, of which the gate is connected to the second circuit point, and the source and the drain are respectively connected to the (2N−1)-level gate signal point and inputting the DC low voltage;
an eleventh thin film transistor, of which the gate is connected to the second circuit point, and the source and the drain are respectively connected to the (2N−1)-level horizontal scanning line and inputting the DC low voltage; and
a twelfth thin film transistor, of which the gate is connected to the 2N-level gate signal point, and the source and the drain are respectively connected to the second circuit point and inputting the DC low voltage.

In the above-described GOA circuit structure, the third pull-down holding circuit further comprises:
a thirteenth thin film transistor, of which the gate is connected to the (2N−1)-level gate signal point, and the source and the drain are respectively connected to the third circuit point and inputting the DC low voltage;
a fourteenth thin film transistor, of which the gate is connected to the third circuit point, and the source and the drain are respectively connected to the 2N-level gate signal point and inputting the DC low voltage;
a fifteenth thin film transistor, of which the gate is connected to the third circuit point, and the source and the drain are respectively connected to the 2N-level horizontal scanning line and inputting the DC low voltage; and
a sixteenth thin film transistor, of which the gate is connected to the 2N-level gate signal point, and the source and the drain are respectively connected to the third circuit point and inputting the DC low voltage.

In the above-described GOA circuit structure, the fourth pull-down holding circuit further comprises:
a seventeenth thin film transistor, of which the gate is connected to the (2N−1)-level gate signal point, and the source and the drain are respectively connected to the fourth circuit point and inputting the DC low voltage;
an eighteenth thin film transistor, of which the gate is connected to the fourth circuit point, and the source and the drain are respectively connected to the 2N-level gate signal point and inputting the DC low voltage;
a nineteenth thin film transistor, of which the gate is connected to the fourth circuit point, and the source and the drain are respectively connected to the 2N-level horizontal scanning line and inputting the DC low voltage; and
a twentieth thin film transistor, of which the gate is connected to the 2N-level gate signal point, and the source and the drain are respectively connected to the fourth circuit point and inputting the DC low voltage.

In the above-described GOA circuit structure, the $(2N-1)$-level GOA unit further comprises a pull-up control circuit, a pull-up circuit, a transfer circuit, a pull-down circuit, and a boast capacitor, wherein the pull-up circuit, the pull-down circuit, and the boast capacitor are respectively connected with the $(2N-1)$-level gate signal point and the $(2N-1)$-level horizontal scanning line, and the pull-up control circuit and the transfer circuit are respectively connected with the $(2N-1)$-level gate signal point; and the 2N-level GOA unit further comprises a pull-up control circuit, a pull-up circuit, a transfer circuit, a pull-down circuit, and a boast capacitor, wherein the pull-up circuit, the pull-down circuit, and the boast capacitor are respectively connected with the 2N-level gate signal point and the 2N-level horizontal scanning line, and the pull-up control circuit and the transfer circuit are respectively connected with the 2N-level gate signal point.

In the above-described GOA circuit structure, the gate signal point of the $(2N-1)$-level GOA unit and the gate signal point of the 2N-level GOA unit are connected together.

In the above-described GOA circuit structure, the $(2N-1)$-level GOA unit further comprises a pull-up circuit, a pull-down circuit, and a boast capacitor, wherein the pull-up circuit, the pull-down circuit, and the boast capacitor are respectively connected with the $(2N-1)$-level gate signal point and the $(2N-1)$-level horizontal scanning line; and the 2N-level GOA unit further comprises a pull-up control circuit, a pull-up circuit, a transfer circuit, a pull-down circuit, and a boast capacitor, wherein the pull-up circuit, the pull-down circuit, and the boast capacitor are respectively connected with the 2N-level gate signal point and the 2N-level horizontal scanning line, and the pull-up control circuit and the transfer circuit are respectively connected with the 2N-level gate signal point.

The present invention also provides a GOA circuit structure, sharing GOA pull-down circuits to reduce TFT stress of the GOA pull-down circuits, which comprises multiple twined GOA units cascaded with each other. Assuming N is a natural number, the N-level GOA unit charges the N-level horizontal scanning line in the displaying area, and each said twined GOA unit comprises the $(2N-1)$-level GOA unit and the 2N-level GOA unit. The $(2N-1)$-level GOA unit comprises a first pull-down holding circuit and a second pull-down holding circuit respectively connected with the $(2N-1)$-level gate signal point and the $(2N-1)$-level horizontal scanning line. The 2N-level GOA unit comprises a third pull-down holding circuit and a fourth pull-down holding circuit respectively connected with the 2N-level gate signal point and the 2N-level horizontal scanning line. The $(2N-1)$-level gate signal point is further connected with the third pull-down holding circuit and the fourth pull-down holding circuit respectively. The 2N-level gate signal point is further connected with the first pull-down holding circuit and the second pull-down holding circuit respectively.

The first pull-down holding circuit comprises:
a first thin film transistor, of which the gate is inputting a second clock signal, and the source and the drain are respectively inputting a first clock signal and connected to a first circuit point, wherein whether the first pull-down holding circuit is working or not depends on the potential level of the first circuit point.

The second pull-down holding circuit comprises:
a second thin film transistor, of which the gate is inputting a fourth clock signal, and the source and the drain are respectively inputting a third clock signal and connected to a second circuit point, wherein whether the second pull-down holding circuit is working or not depends on the potential level of the second circuit point.

The third pull-down holding circuit comprises:
a third thin film transistor, of which the gate is inputting a third clock signal, and the source and the drain are respectively inputting a second clock signal and connected to a third circuit point, wherein whether the third pull-down holding circuit is working or not depends on the potential level of the third circuit point.

The fourth pull-down holding circuit comprises:
a fourth thin film transistor, of which the gate is inputting a first clock signal, and the source and the drain are respectively inputting a fourth clock signal and connected to a fourth circuit point, wherein whether the fourth pull-down holding circuit is working or not depends on the potential level of the fourth circuit point.

The first clock signal, the second clock signal, the third clock signal, and the fourth clock signal are provided to make the first pull-down holding circuit, the second pull-down holding circuit, the third pull-down holding circuit, and the fourth pull-down holding circuit work alternately.

A first pull-up clock signal, a second pull-up clock signal, a third pull-up clock signal, and a fourth pull-up clock signal are respectively input into the pull-up circuits of the GOA units of the $(2N-1)$-level, the 2N-level, the $(2N+1)$-level, and the $(2N+2)$-level to respectively charge the corresponding horizontal scanning line in the displaying area. The first clock signal, the second clock signal, the third clock signal, and the fourth clock signal respectively correspond to the first pull-up clock signal, the second pull-up clock signal, the third pull-up clock signal, and the fourth pull-up clock signal.

The first clock signal, the second clock signal, the third clock signal, and the fourth clock signal respectively correspond to four low-frequency clock signals.

The first pull-down holding circuit further comprises:
a fifth thin film transistor, of which the gate is connected to the $(2N-1)$-level gate signal point, and the source and the drain are respectively connected to the first circuit point and inputting a DC low voltage, a sixth thin film transistor, of which the gate is connected to the first circuit point, and the source and the drain are respectively connected to the $(2N-1)$-level gate signal point and inputting the DC low voltage, a seventh thin film transistor, of which the gate is connected to the first circuit point, and the source and the drain are respectively connected to the $(2N-1)$-level horizontal scanning line and inputting the DC low voltage, and an eighth thin film transistor, of which the gate is connected to the 2N-level gate signal point, and the source and the drain are respectively connected to the first circuit point and inputting the DC low voltage.

The second pull-down holding circuit further comprises:
a ninth thin film transistor, of which the gate is connected to the $(2N-1)$-level gate signal point, and the source and the drain are respectively connected to the second circuit point and inputting the DC low voltage, a tenth thin film transistor, of which the gate is connected to the second circuit point, and the source and the drain are respectively connected to the $(2N-1)$-level gate signal point and inputting the DC low voltage, an eleventh thin film transistor, of which the gate is connected to the second circuit point, and the source and the drain are respectively connected to the $(2N-1)$-level horizontal scanning line and inputting the DC low voltage, and a twelfth thin film transistor, of which the gate is connected to the 2N-level gate signal point, and the source and the drain are respectively connected to the second circuit point and inputting the DC low voltage.

The third pull-down holding circuit further comprises:

a thirteenth thin film transistor, of which the gate is connected to the (2N−1)-level gate signal point, and the source and the drain are respectively connected to the third circuit point and inputting the DC low voltage, a fourteenth thin film transistor, of which the gate is connected to the third circuit point, and the source and the drain are respectively connected to the 2N-level gate signal point and inputting the DC low voltage, a fifteenth thin film transistor, of which the gate is connected to the third circuit point, and the source and the drain are respectively connected to the 2N-level horizontal scanning line and inputting the DC low voltage, and a sixteenth thin film transistor, of which the gate is connected to the 2N-level gate signal point, and the source and the drain are respectively connected to the third circuit point and inputting the DC low voltage.

The fourth pull-down holding circuit further comprises:

a seventeenth thin film transistor, of which the gate is connected to the (2N−1)-level gate signal point, and the source and the drain are respectively connected to the fourth circuit point and inputting the DC low voltage, an eighteenth thin film transistor, of which the gate is connected to the fourth circuit point, and the source and the drain are respectively connected to the 2N-level gate signal point and inputting the DC low voltage, a nineteenth thin film transistor, of which the gate is connected to the fourth circuit point, and the source and the drain are respectively connected to the 2N-level horizontal scanning line and inputting the DC low voltage, and a twentieth thin film transistor, of which the gate is connected to the 2N-level gate signal point, and the source and the drain are respectively connected to the fourth circuit point and inputting the DC low voltage.

In the above-described GOA circuit structure, the (2N−1)-level GOA unit further comprises a pull-up control circuit, a pull-up circuit, a transfer circuit, a pull-down circuit, and a boast capacitor, wherein the pull-up circuit, the pull-down circuit, and the boast capacitor are respectively connected with the (2N−1)-level gate signal point and the (2N−1)-level horizontal scanning line, and the pull-up control circuit and the transfer circuit are respectively connected with the (2N−1)-level gate signal point; and the 2N-level GOA unit further comprises a pull-up control circuit, a pull-up circuit, a transfer circuit, a pull-down circuit, and a boast capacitor, wherein the pull-up circuit, the pull-down circuit, and the boast capacitor are respectively connected with the 2N-level gate signal point and the 2N-level horizontal scanning line, and the pull-up control circuit and the transfer circuit are respectively connected with the 2N-level gate signal point.

In the above-described GOA circuit structure, the gate signal point of the (2N−1)-level GOA unit and the gate signal point of the 2N-level GOA unit are connected together.

In the above-described GOA circuit structure, the (2N−1)-level GOA unit further comprises a pull-up circuit, a pull-down circuit, and a boast capacitor, wherein the pull-up circuit, the pull-down circuit, and the boast capacitor are respectively connected with the (2N−1)-level gate signal point and the (2N−1)-level horizontal scanning line; and the 2N-level GOA unit further comprises a pull-up control circuit, a pull-up circuit, a transfer circuit, a pull-down circuit, and a boast capacitor, wherein the pull-up circuit, the pull-down circuit, and the boast capacitor are respectively connected with the 2N-level gate signal point and the 2N-level horizontal scanning line, and the pull-up control circuit and the transfer circuit are respectively with the 2N-level gate signal point.

The GOA circuit structure sharing GOA pull-down circuits to reduce TFT stress of the GOA pull-down circuits according to the present invention makes each portion work for ¼ time and take rest for ¾ time by sharing the pull-down holding circuit, which can reduce the TFT stress of the pull-down holding circuit. Sharing Q point can reduce the modules with partially similar function in the GOA circuit. Two-level circuits only need one pull-up control part, which can achieve the twice rise of QS point potential, and is beneficial to the input of the gate signal. Using four low frequency signals to control the pull-down holding circuit can reduce the power consumption of the circuit, and more negative LCL is beneficial to the recovery of the negative stress.

BRIEF DESCRIPTION OF THE DRAWINGS

The following detailed descriptions accompanying drawings and the embodiment of the present invention make the aspect of the present invention and the other beneficial effect more obvious.

DETAILED DESCRIPTION OF THE PREFERRED EMBODIMENTS

Figure 2:
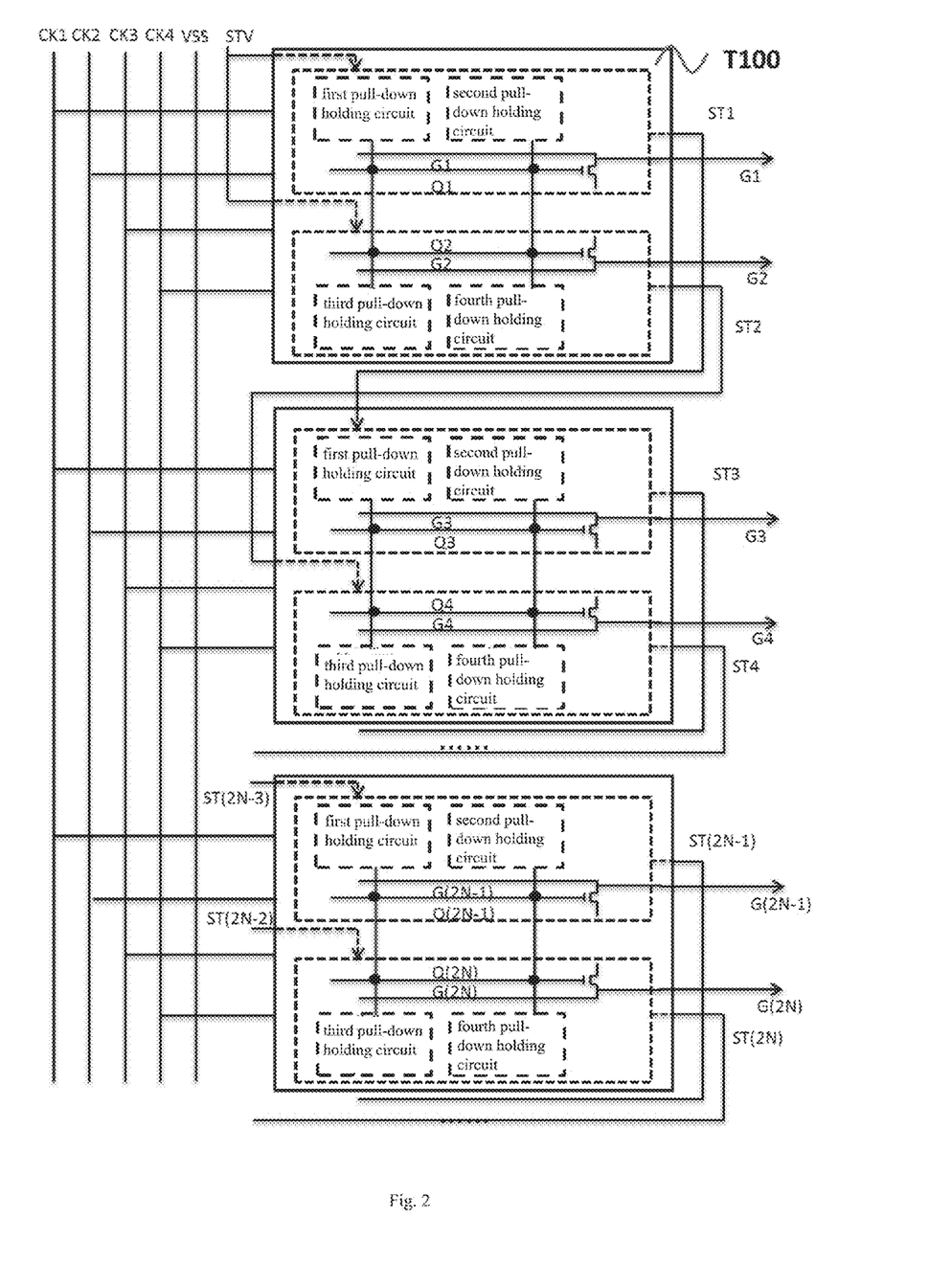
FIG. 2 is a schematic view illustrating the multi-level framework of the GOA circuit structure according to the present invention.

Referring to FIG. 2, it is a schematic view illustrating the multi-level framework of the GOA circuit structure according to the present invention. The present invention provides a new GOA circuit framework, in which every two-level GOA circuits share the Q points of the pull-down holding circuit and the pull-up control circuit. Every two-level GOA circuits will output two-level gate waveform, which is called as twined-GOA unit (shown as T100 in FIG. 2). Each twined-GOA receives CK1/CK2/CK3/CK4/VSS/STV signals to drive the circuit, which mainly outputs two gate waveforms. The four pull-down holding circuits in the twined-GOA work alternately. In this way, each unit only need ¼ time to work, and the rest ¾ time can be used to recover the stress, which can significantly reduce the stress and improve the operating life time of the GOA circuit.

Figure 3:
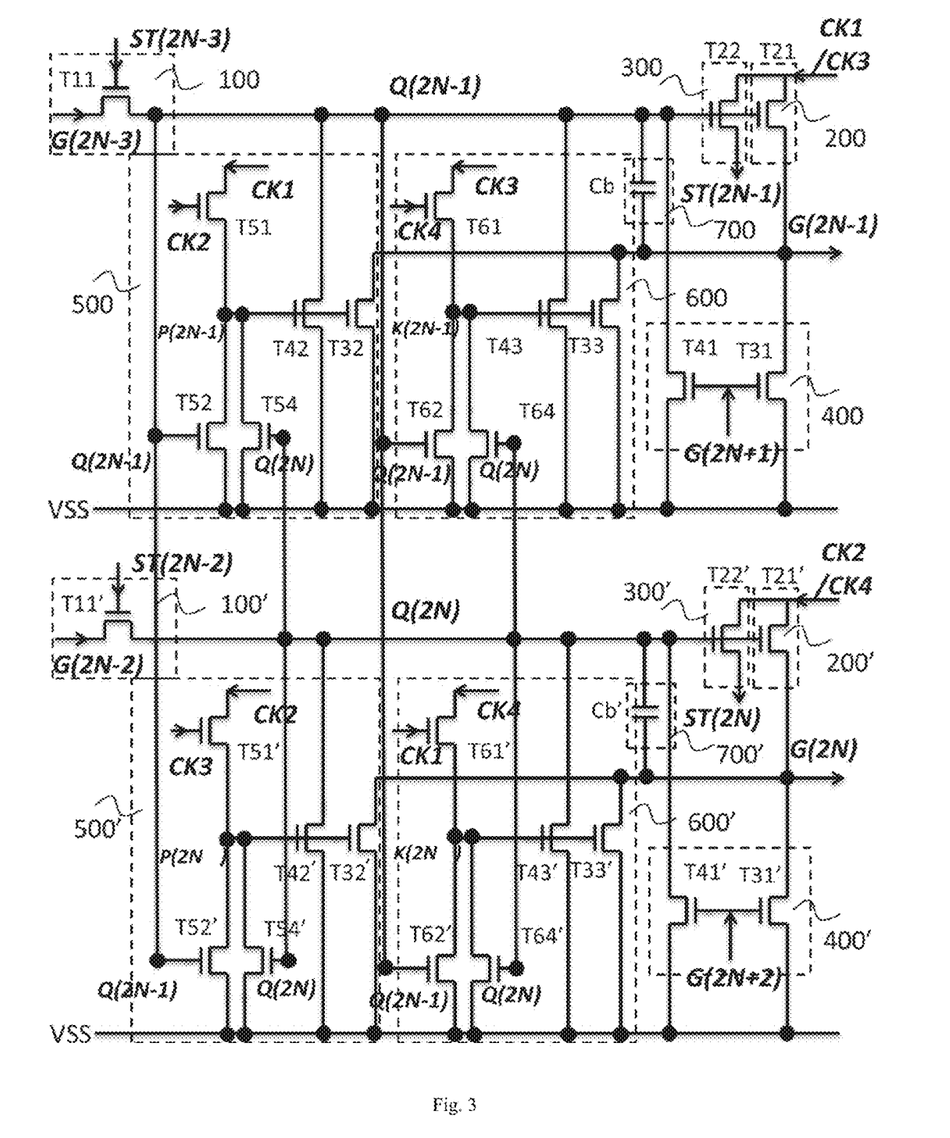
FIG. 3 is a schematic view illustrating the circuit structure of the GOA circuit structure according to the first preferred embodiment of the present invention.

Referring to FIG. 3, it is a schematic view illustrating the circuit structure of the GOA circuit structure according to the first preferred embodiment of the present invention. The twined GOA unit mainly comprises the following portions: pull-up control circuits 100 and 100', pull-up circuits 200 and 200', transfer circuits 300 and 300', pull-down circuits 400 and 400', a first pull-down holding circuit 500, a second pull-down holding circuit 600, a third pull-down holding circuit 500', and a fourth pull-down holding circuit 600', boast capacitors 700 and 700'. The first pull-down holding circuit 500, the second pull-down holding circuit 600, the third pull-down holding circuit 500', and the fourth pull-down holding circuit 600' form four pull-down holding circuits and work alternately, so there is more time to recover the stress.

In the first pull-down holding circuit 500, the T51 Gate terminal is connected with the CK2, the Drain terminal is connected with the CK1, the Source terminal is connected with the P(2N−1). In the second pull-down holding circuit 600, the T61 Gate terminal is connected with the CK4, the Drain terminal is connected with the CK3, the Source terminal is connected with the K(2N−1). In the third pull-down holding circuit 500', the T51' Gate terminal is connected with the CK3, the Drain terminal is connected with the CK2, the Source terminal is connected with the P(2N). In the fourth pull-down holding circuit 600', the T61' Gate terminal is connected with the CK1, the Drain terminal is connected with the CK4, the Source terminal is connected with the K(2N). Therefore, the overlapped time sequence within the CK signals can generate four independent control signals P(2N−1), K(2N−1), P(2N), and K(2N) of the pull-down holding circuits.

The Gate terminals of T52, T52', T62, and T62' are connected with the Q(2N−1), the Gate terminals of T54, T54', T64, and T64' are connected with the Q(2N), which is used to close the pull-down holding circuit of the twined GOA unit when outputting the gate signal.

Figure 4:
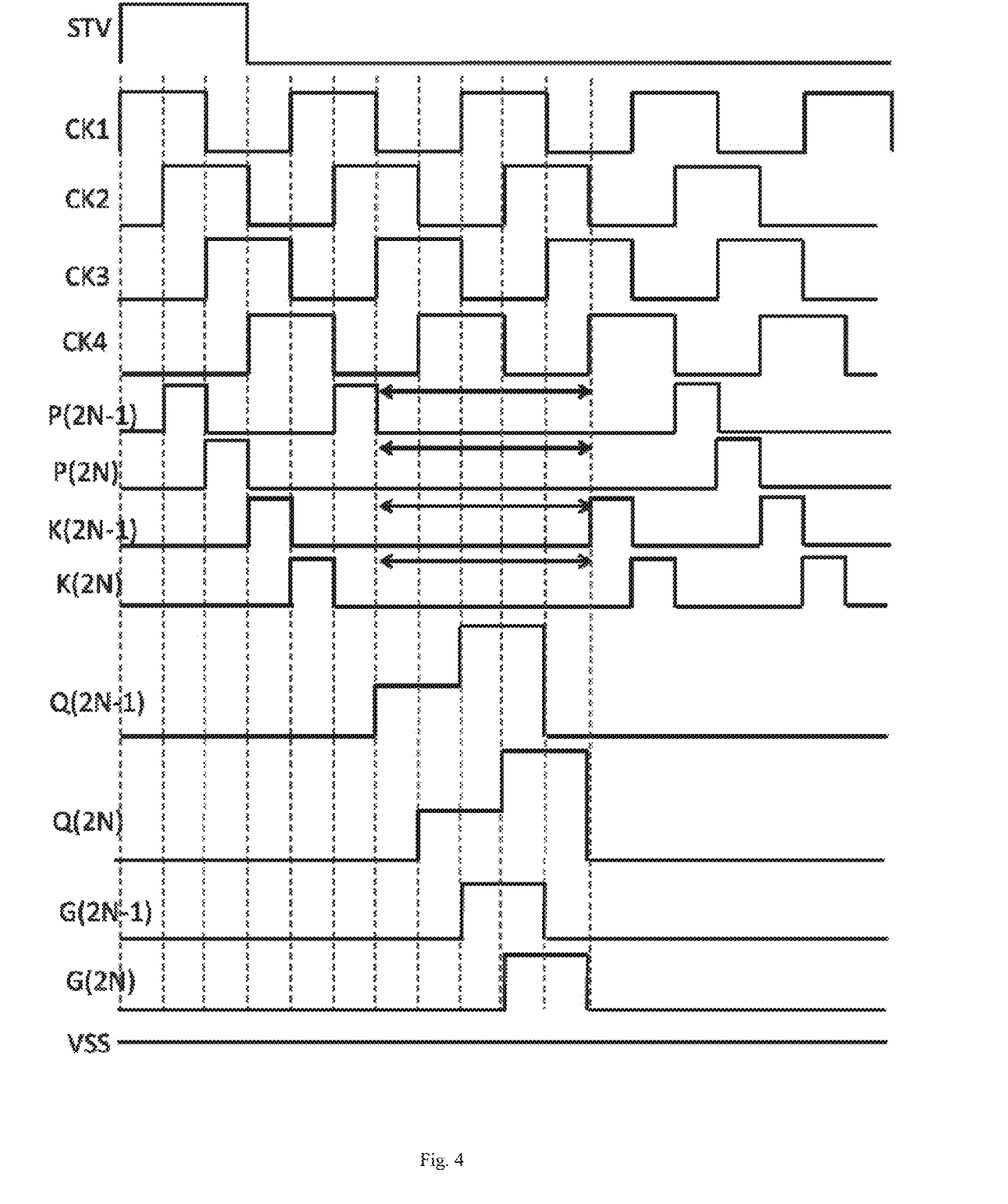
FIG. 4 is a schematic waveform diagram of the input signal and each key node of the circuit structure shown in FIG. 3.

Referring to FIG. 4, it is a schematic waveform diagram of the input signal and each key node of the circuit structure shown in FIG. 3. It can be seen that the working times of the P(2N−1), the K(2N−1), the P(2N), and the K(2N) are ¼, and the stress recovery times are ¾. Moreover, the Q(2N−1), the Q(2N), the G(2N−1), and the G(2N) of the twined GOA circuit shown in FIG. 3 are independent, so only the P(2N−1) and the K(2N−1) are holding the Q(2N−1) and the G(2N−1), and only the P(2N) and the K(2N) are holding the Q(2N) and the G(2N) actually. Namely, each sub-circuit in each level twined GOA circuit only uses half time to hold, which has higher risk for Q point and needs to be improved.

Figure 5:
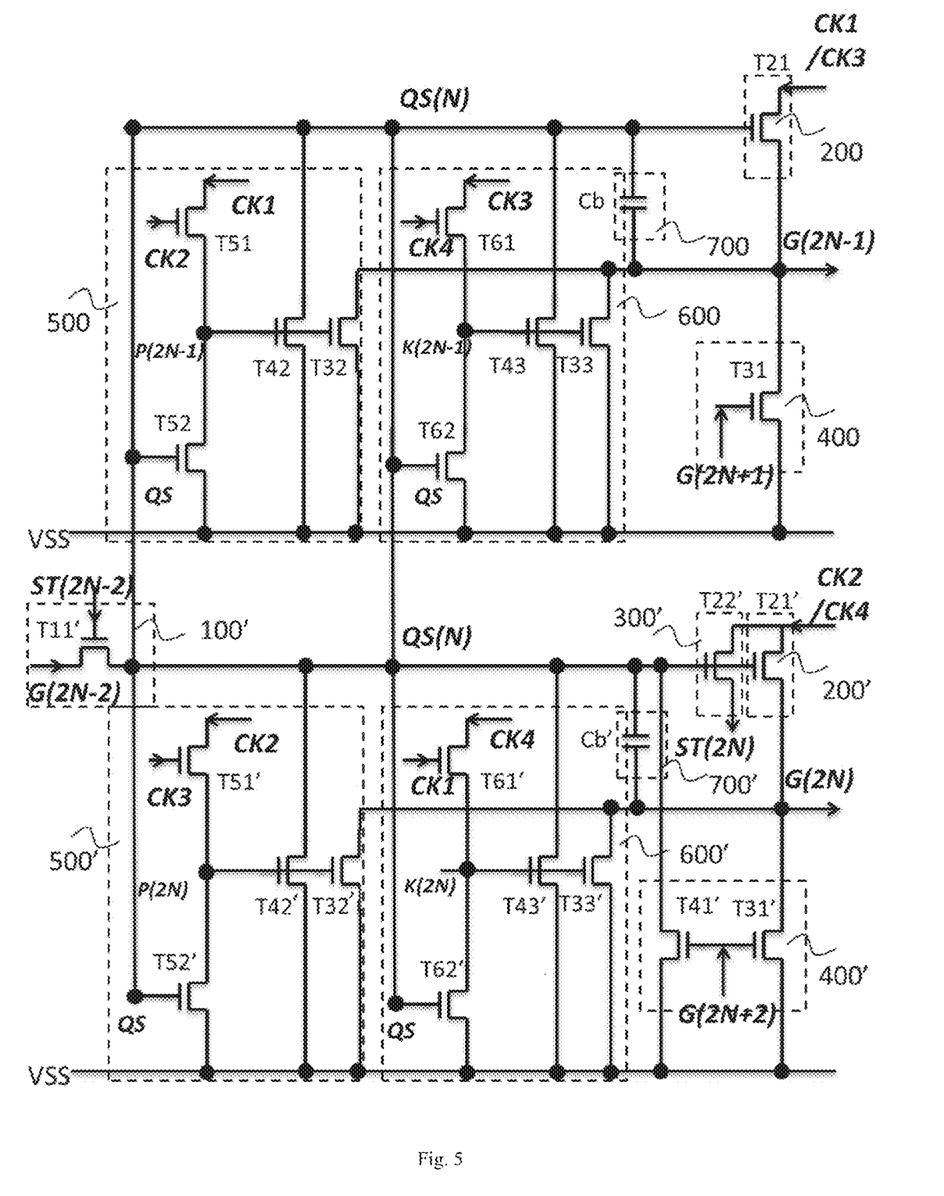
FIG. 5 is a schematic view illustrating the circuit structure of the GOA circuit structure according to the second preferred embodiment of the present invention.

Referring to FIG. 5, it is a schematic view illustrating the circuit structure of the GOA circuit structure according to the second preferred embodiment of the present invention. Accompanying with FIG. 3, it can be seen that FIG. 5 is to improve the Q(2N−1) and the Q(2N) on the circuit structure shown in FIG. 3, that is Q sharing (QS point) of the two-level GOA, so that the four pull-down holding circuits can continuously work on the Q point. It cannot also reduce the stress effect of the pull-down holding circuit, but also solve the risk of the Q point in the circuit structure shown in FIG. 3.

The basic circuit framework comprises: a shared pull-up control circuit 100', a shared transfer circuit 300', two pull-up circuits 200 and 200', two pull-down circuits 400 and 400', two boast capacitors, and four shared pull-down holding circuit. Comparing to the circuit structure shown in FIG. 3, this Q sharing framework removes some extra TFT, which is not only more simple and practical, but also has weak stress and low risk of Q point.

The Gate terminals of the T52, the T62, the T52', and the T62' are connected with the QS point, the Drain terminals are respectively connected with the P(2N−1), the K(2N−1), the P(2N), and the K(2N), the Source terminals are connected with DC voltage VSS, which mainly close the pull-down holding circuit as QS high level. T41' is mainly used to release the charge of the QS point; T31 is used to pull down the G(2N−1). Because T21 can assist in releasing the G(2N−1) when QS is turned on, the size of T31 can be smaller. T31' is used to pull-down the G(2N); T22' is used as the transfer signal of the twined GOA unit circuit.

Figure 6:
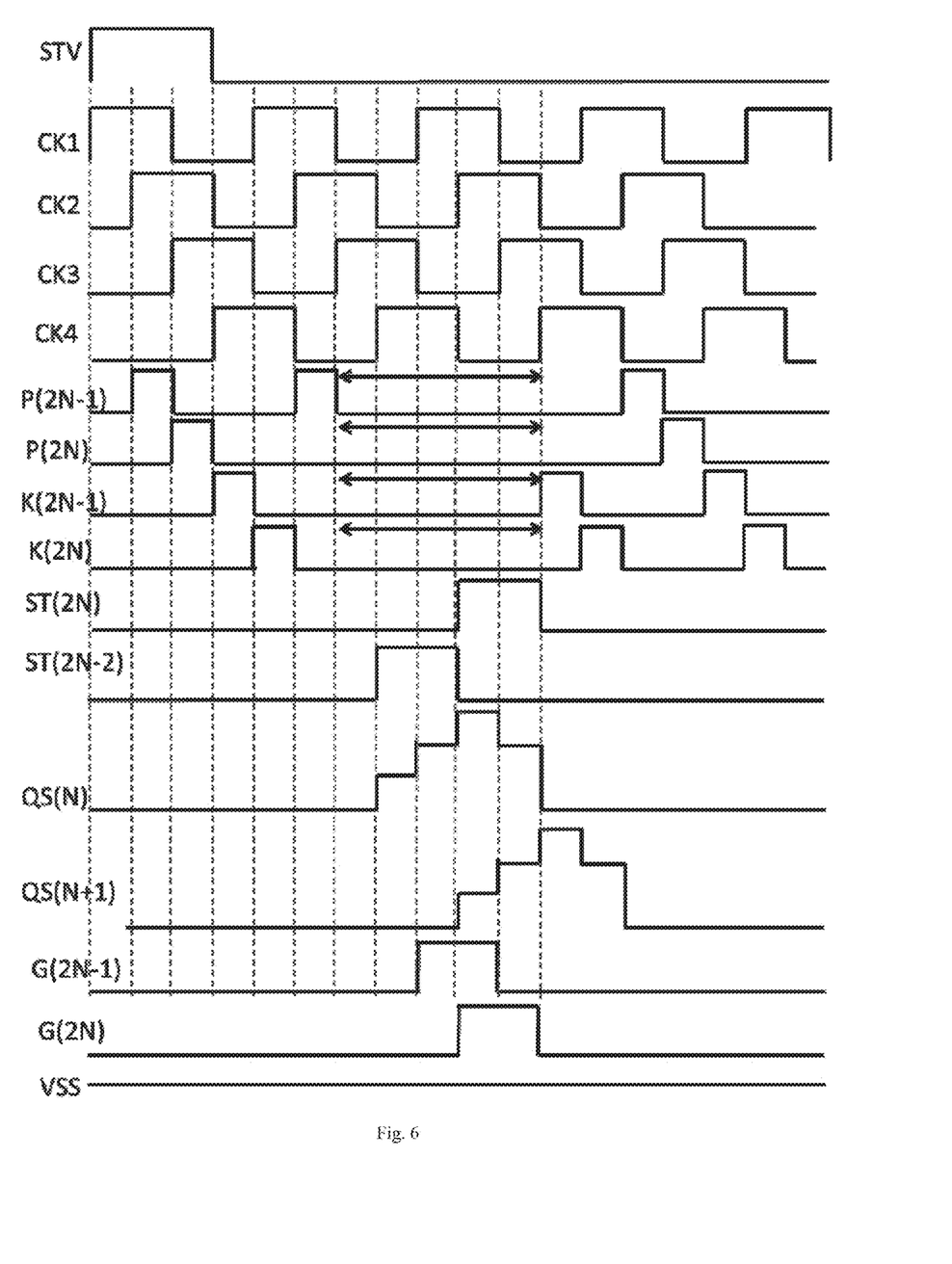
FIG. 6 is a schematic view illustrating the control signal and each node signal of the circuit structure shown in FIG. 5.

Referring to FIG. 6, it is a schematic view illustrating the control signal and each node signal of the circuit structure shown in FIG. 5. The change of the QS(N) point is more complicated, which can achieve multiple rise. STV signal is the circuit starting signal, which is only turned on when starting scanning, and then is under low potential. The duty ratio of CK signal is 50%, and then use the overlapped time sequence within the CK signals to generate four independent control signals P(2N−1), K(2N−1), P(2N), and K(2N) of the pull-down holding circuits. The latter-level twined GOA unit transfer signal is only connected to the even-level GOA sub-circuit. Therefore, the time sequence is the same as CK2 and CK4. It is mainly to avoid the charging mistake after sharing Q point.

QS(N) has three chances to rise. The first is the transfer signal input into the T11' of the pull-up control circuit, the second is CK1 or CK3 signal input into the G(2N−1), and the third is CK2 or CK4 signal input into the G(2N). Therefore, the potential of the Q point can be raised to higher, which is beneficial to the input of the G(2N−1) and the G(2N) signal, and will generate the potential change of QS(N) as shown in Figure.

Figure 7:
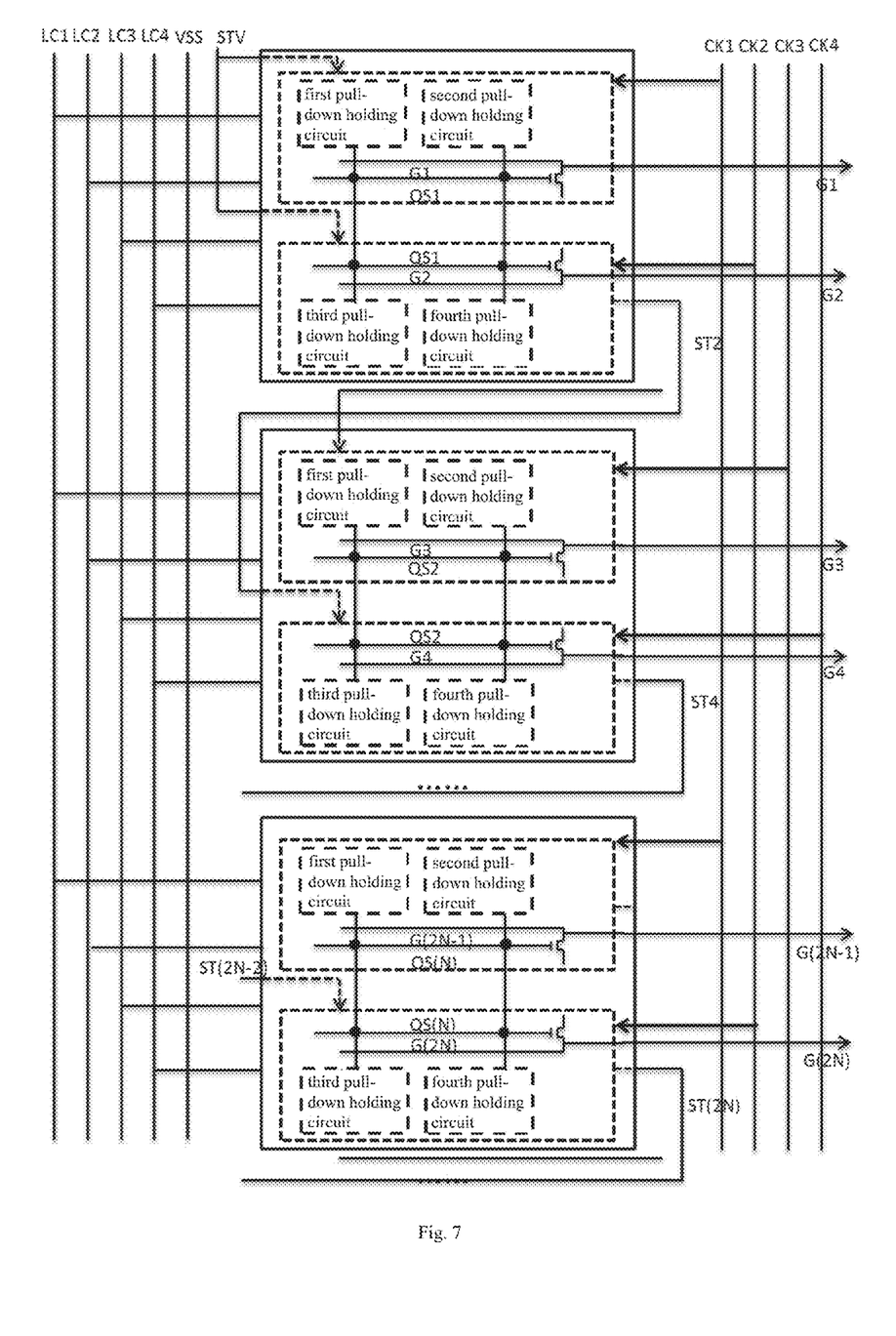
FIG. 7 is a schematic view illustrating another signal connection of the circuit structure shown in FIG. 5.

Referring to FIG. 7, it is a schematic view illustrating another signal connection of the circuit structure shown in FIG. 5. The four pull-down holding circuits are respectively connected to four low frequency or ultra-low frequency signal (LC) and generate the P(2N−1), the K(2N−1), the P(2N), and the K(2N) signal as shown in the drawing. Moreover, the low frequency signal low potential (LCL) can be set less than the DC low voltage VSS, so that it can proceed with one negative stress recovery in the ¾ rest time, which is more beneficial to reduce the stress. It can also reduce the power consumption, but it will increase the layout difficulty.

The present invention utilizes the misalignment of the clock signal, the GOA pull-down circuit sharing, and Q sharing to reduce half working time of the pull-down holding circuit, which has more time to recover the stress and reduce the main stress effect of the pull-down TFT. Using four low frequency signals can reduce the power consumption, and controlling the low-frequency signal negative potential can also recover the main stress effect of the pull-down TFT of the pull-down holding circuit.

Figure 8:
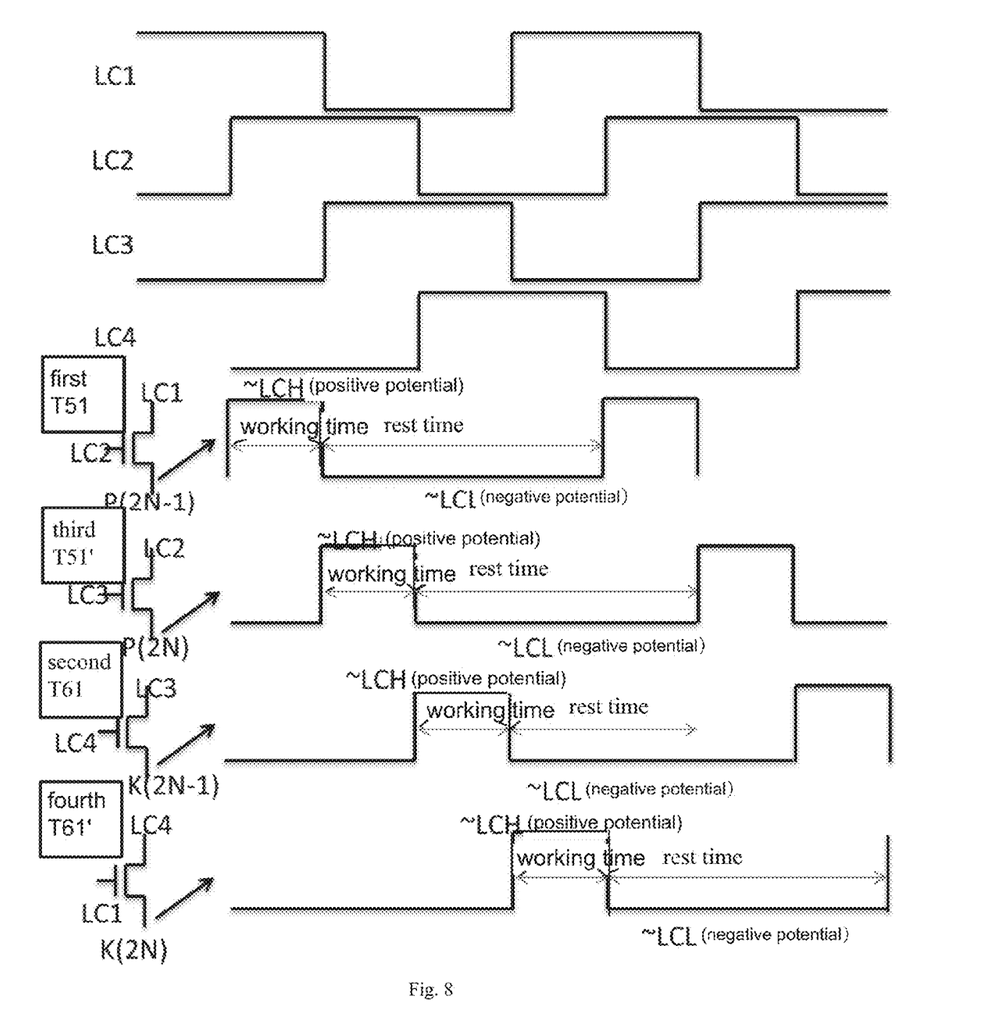
FIG. 8 is a schematic view illustrating the LC signal sequence and the signal connection of the four pull-down holding circuits shown in FIG. 7.

Referring to FIG. 8, it is a schematic view illustrating the LC signal sequence and the signal connection of the four pull-down holding circuits shown in FIG. 7. T51 Gate terminal is connected with LC2, the Drain terminal is connected with LC1, and the Source terminal is connected with P(2N−1); T61 Gate terminal is connected with LC4, the Drain terminal is connected with LC3, and the Source terminal is connected with K(2N−1); T51' Gate terminal is connected with LC3, the Drain terminal is connected with LC2, and the Source terminal is connected with P(2N); and T61' Gate terminal is connected with LC1, the Drain terminal is connected with LC4, and the Source terminal is connected with K(2N). In this way, using the overlapped time sequence within the CK signals can generate four independent control signals P(2N−1), K(2N−1), P(2N), and K(2N) of the pull-down holding circuits.

The high frequency signals CK1, CK2, CK3, and CK4 according to the present invention can be the clock signal with the same waveform and with a quarter-cycle difference in sequence. The low frequency signal can also be selected with the same condition.

In summary, the GOA circuit structure according to the present invention has the following advantages:

(1) The pull-down holding circuit of two-level GOA circuit is shared, so there will be four pull-down holding circuits working on one-level GOA circuit, then each circuit only needs to work for ¼ time, and the other ¾ time can be used to recover the stress, which minimizes the stress effect and prolongs the working life time of the pull-down holding circuit.

(2) The adjacent levels share Q point, constructing twined-GOA structure, which can simplify the circuit and raise the Q point multiple times.

(3) The input control signal after the pull-down holding circuit of two-level GOA circuit being shared can utilize the original high frequency signal, use the forms of connection in pairs to connect the Gate terminal and the Drain terminal of TFT; it can also additionally add four low frequency, even ultra-low frequency signal, which can reduce the power consumption; it can also have better stress recovery through low potential of low frequency signal.

In summary, many other possible modifications and variations can be made by those skilled in the art without departing from the spirit and scope of the invention as hereinafter claimed, and those modifications and variations are considered encompassed in the scope of protection defined by the claims of the present invention.

What is claimed is:

1. A GOA circuit structure, comprising multiple twined GOA units cascaded with each other, assuming N is natural number, the N-level GOA unit charging the N-level horizontal scanning line in the displaying area, each said twined GOA unit comprising the (2N−1)-level GOA unit and the 2N-level GOA unit, the (2N−1)-level GOA unit comprising a first pull-down holding circuit and a second pull-down holding circuit respectively connected with the (2N−1)-level gate signal point and the (2N−1)-level horizontal scanning line, the 2N-level GOA unit comprising a third pull-down holding circuit and a fourth pull-down holding circuit respectively connected with the 2N-level gate signal point and the 2N-level horizontal scanning line; the (2N−1)-level gate signal point being further connected with the third pull-down holding circuit and the fourth pull-down holding circuit respectively, the 2N-level gate signal point being further connected with the first pull-down holding circuit and the second pull-down holding circuit respectively;

the first pull-down holding circuit comprising:
a first thin film transistor, the gate thereof inputting a second clock signal, the source and the drain thereof respectively inputting a first clock signal and being connected to a first circuit point, the first pull-down holding circuit working or not depending on the potential level of the first circuit point;

the second pull-down holding circuit comprising:
a second thin film transistor, the gate thereof inputting a fourth clock signal, the source and the drain thereof respectively inputting a third clock signal and being connected to a second circuit point, the second pull-down holding circuit working or not depending on the potential level of the second circuit point;

the third pull-down holding circuit comprising:
a third thin film transistor, the gate thereof inputting a third clock signal, the source and the drain thereof respectively inputting a second clock signal and being connected to a third circuit point, the third pull-down holding circuit working or not depending on the potential level of the third circuit point;

the fourth pull-down holding circuit comprising:
a fourth thin film transistor, the gate thereof inputting a first clock signal, the source and the drain thereof respectively inputting a fourth clock signal and being connected to a fourth circuit point, the fourth pull-down holding circuit working or not depending on the potential level of the fourth circuit point;

the first clock signal, the second clock signal, the third clock signal, and the fourth clock signal being provided to make the first pull-down holding circuit, the second pull-down holding circuit, the third pull-down holding circuit, and the fourth pull-down holding circuit work alternately;

wherein a first pull-up clock signal, a second pull-up clock signal, a third pull-up clock signal, and a fourth pull-up clock signal are respectively input into the pull-up circuits of the (2N−1)-level, the 2N-level, the (2N+1)-level, and the (2N+2)-level GOA units to respectively charge the corresponding horizontal scanning line in the displaying area, the first clock signal, the second clock signal, the third clock signal, and the fourth clock signal respective correspond to the first pull-up clock signal, the second pull-up clock signal, the third pull-up clock signal, and the fourth pull-up clock signal;

wherein the first clock signal, the second clock signal, the third clock signal, and the fourth clock signal respectively correspond to four low-frequency clock signals;

wherein the first pull-down holding circuit further comprises:
a fifth thin film transistor, the gate thereof being connected to the (2N−1)-level gate signal point, the source and the drain thereof being respectively connected to the first circuit point and inputting a DC low voltage,
a sixth thin film transistor, the gate thereof being connected to the first circuit point, the source and the drain thereof being respectively connected to the (2N−1)-level gate signal point and inputting the DC low voltage,
a seventh thin film transistor, the gate thereof being connected to the first circuit point, the source and the drain thereof being respectively connected to the (2N−1)-level horizontal scanning line and inputting the DC low voltage, and
an eighth thin film transistor, the gate thereof being connected to the 2N-level gate signal point, the source and the drain thereof being respectively connected to the first circuit point and inputting the DC low voltage;

wherein the second pull-down holding circuit further comprises:
a ninth thin film transistor, the gate thereof being connected to the (2N−1)-level gate signal point, the source and the drain thereof being respectively connected to the second circuit point and inputting the DC low voltage,
a tenth thin film transistor, the gate thereof being connected to the second circuit point, the source and the drain thereof being respectively connected to the (2N−1)-level gate signal point and inputting the DC low voltage,
an eleventh thin film transistor, the gate thereof being connected to the second circuit point, the source and the drain thereof being respectively connected to the (2N−1)-level horizontal scanning line and inputting the DC low voltage, and
a twelfth thin film transistor, the gate thereof being connected to the 2N-level gate signal point, the source and the drain thereof being respectively connected to the second circuit point and inputting the DC low voltage;

wherein the third pull-down holding circuit further comprises:
a thirteenth thin film transistor, the gate thereof being connected to the (2N−1)-level gate signal point, the source and the drain thereof being respectively connected to the third circuit point and inputting the DC low voltage,
a fourteenth thin film transistor, the gate thereof being connected to the third circuit point, the source and the drain thereof being respectively connected to the 2N-level gate signal point and inputting the DC low voltage,
a fifteenth thin film transistor, the gate thereof being connected to the third circuit point, the source and the drain thereof being respectively connected to the 2N-level horizontal scanning line and inputting the DC low voltage, and
a sixteenth thin film transistor, the gate thereof being connected to the 2N-level gate signal point, the source and the drain thereof being respectively connected to the third circuit point and inputting the DC low voltage;
wherein the fourth pull-down holding circuit further comprises:
a seventeenth thin film transistor, the gate thereof being connected to the (2N−1)-level gate signal point, the source and the drain thereof being respectively connected to the fourth circuit point and inputting the DC low voltage,
an eighteenth thin film transistor, the gate thereof being connected to the fourth circuit point, the source and the drain thereof being respectively connected to the 2N-level gate signal point and inputting the DC low voltage,
a nineteenth thin film transistor, the gate thereof being connected to the fourth circuit point, the source and the drain thereof being respectively connected to the 2N-level horizontal scanning line and inputting the DC low voltage, and
a twentieth thin film transistor, the gate thereof being connected to the 2N-level gate signal point, the source and the drain thereof being respectively connected to the fourth circuit point and inputting the DC low voltage.

2. The GOA circuit structure as claimed in claim 1, wherein the (2N−1)-level GOA unit further comprises a pull-up control circuit, a pull-up circuit, a transfer circuit, a pull-down circuit, and a boast capacitor, the pull-up circuit, the pull-down circuit, and the boast capacitor are respectively connected with the (2N−1)-level gate signal point and the (2N−1)-level horizontal scanning line, the pull-up control circuit and the transfer circuit are respectively connected with the (2N−1)-level gate signal point; and the 2N-level GOA unit further comprises a pull-up control circuit, a pull-up circuit, a transfer circuit, a pull-down circuit, and a boast capacitor, the pull-up circuit, the pull-down circuit, and the boast capacitor are respectively connected with the 2N-level gate signal point and the 2N-level horizontal scanning line, the pull-up control circuit and the transfer circuit are respectively connected with the 2N-level gate signal point.

3. The GOA circuit structure as claimed in claim 1, wherein the gate signal point of the (2N−1)-level GOA unit and the gate signal point of the 2N-level GOA unit are connected together.

4. The GOA circuit structure as claimed in claim 1, wherein the (2N−1)-level GOA unit further comprises a pull-up circuit, a pull-down circuit, and a boast capacitor, the pull-up circuit, the pull-down circuit, and the boast capacitor are respectively connected with the (2N−1)-level gate signal point and the (2N−1)-level horizontal scanning line; and the 2N-level GOA unit further comprises a pull-up control circuit, a pull-up circuit, a transfer circuit, a pull-down circuit, and a boast capacitor, the pull-up circuit, the pull-down circuit, and the boast capacitor are respectively connected with the 2N-level gate signal point and the 2N-level horizontal scanning line, the pull-up control circuit and the transfer circuit are respectively with the 2N-level gate signal point.

* * * * *